United States Patent
Chang et al.

(10) Patent No.: US 11,049,764 B1
(45) Date of Patent: Jun. 29, 2021

(54) METHOD FOR FABRICATING A SEMICONDUCTOR DEVICE

(71) Applicant: UNITED MICROELECTRONICS CORP., Hsinchu (TW)

(72) Inventors: Jung-Che Chang, Tainan (TW); Bao-Tzeng Huang, Pingtung County (TW); Yu-Hong Huang, Tainan (TW); Siou-Cyun Lin, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/712,203

(22) Filed: Dec. 12, 2019

(51) Int. Cl.
*H01L 21/768* (2006.01)
*H01L 23/522* (2006.01)
*H01L 49/02* (2006.01)

(52) U.S. Cl.
CPC .... *H01L 21/76813* (2013.01); *H01L 21/7681* (2013.01); *H01L 21/76877* (2013.01); *H01L 23/5226* (2013.01); *H01L 28/20* (2013.01); *H01L 28/60* (2013.01)

(58) Field of Classification Search
None
See application file for complete search history.

(56) References Cited

U.S. PATENT DOCUMENTS

| | | | |
|---|---|---|---|
| 5,801,094 A | 9/1998 | Yew et al. | |
| 6,140,226 A | 10/2000 | Grill et al. | |
| 6,720,249 B1 | 4/2004 | Dalton et al. | |
| 7,378,343 B2 | 5/2008 | Chen et al. | |
| 7,960,821 B2 | 6/2011 | Chen et al. | |
| 8,399,359 B2 | 3/2013 | Mi et al. | |
| 2004/0219796 A1 | 11/2004 | Wu | |
| 2005/0082592 A1* | 4/2005 | Chang | H01L 23/5223 257/306 |
| 2005/0239286 A1 | 10/2005 | Wu et al. | |
| 2011/0104895 A1* | 5/2011 | Hsieh | H01L 21/76844 438/675 |
| 2014/0151899 A1* | 6/2014 | Coolbaugh | H01L 21/76813 257/774 |

* cited by examiner

*Primary Examiner* — Asok K Sarkar
(74) *Attorney, Agent, or Firm* — WPAT, PC

(57) ABSTRACT

A method for fabricating a semiconductor device comprises: providing a substrate having a top surface; forming a bottom metal embedded in the substrate; forming a first etch stop layer, a first dielectric layer, a second etch stop layer and a second dielectric layer sequentially stacked on the top surface of the substrate; forming a semiconductor element disposed on the first etch stop layer, wherein the semiconductor element comprises a top plate and an etch stop pad disposed on the top plate; performing a first etching process to form a first partial via and a second partial via penetrating the second dielectric layer, the second etch stop layer and a portion of the first dielectric layer, wherein the first partial via is separated from the bottom metal by the first dielectric layer, and the second partial via is separated from the top plate by the etch stop pad.

10 Claims, 3 Drawing Sheets

METHOD FOR FABRICATING A SEMICONDUCTOR DEVICE

BACKGROUND OF THE INVENTION

Field of the Invention

The invention relates in general to a method for fabricating a semiconductor device, and more particularly to a method for fabricating a semiconductor device including a semiconductor element.

Description of the Related Art

With a trend toward scaling down the size of the semiconductor device, a process for fabricating interconnections in the semiconductor device is quite critical. For example, a dual damascene process is one of methods for providing interconnections to connect the numerous layers of metallization in the semiconductor device.

In the conventional dual damascene process, a via may be formed first, and then a trench connected to the via may be formed. However, if an etching process for forming the trench is not well-controlled, a metal layer below the via may be damaged simultaneously. Although a gap fill plug (GFP) process can be used to provide a resist layer in the via for protecting the metal layer below the via during forming the trench, the additional step will increase the cost and the time.

Therefore, there is a need for developing an improved method for fabricating interconnections in the semiconductor device.

SUMMARY OF THE INVENTION

The invention is directed to a method for fabricating a semiconductor device. In the present application, during fabricating a semiconductor device including a semiconductor element, a first partial via corresponding to a bottom metal is formed and separated from the bottom metal by a first dielectric layer, and a second partial via corresponding to a top plate in the semiconductor element is formed and separated from the top plate by an etch stop pad disposed on the top plate. In other words, the first partial via is not directly connected to the bottom metal and the second partial via is not directly connected to the top plate, either. Thus, in the following step of forming trenches connected to the first partial via and the second partial via, the first dielectric layer can protect the bottom metal from being damaged, and the etch stop pad can protect the top plate from being damaged. In this way, a gap fill plug (GFP) process can be omitted, and the cost can be reduced.

According to an aspect of the present invention, a method for fabricating a semiconductor device is provided. The method comprises: providing a substrate having a top surface; forming a bottom metal embedded in the substrate; forming a first etch stop layer, a first dielectric layer, a second etch stop layer and a second dielectric layer sequentially stacked on the top surface of the substrate; forming a semiconductor element disposed on the first etch stop layer, wherein the semiconductor element comprises a top plate and an etch stop pad disposed on the top plate; performing a first etching process to form a first partial via and a second partial via penetrating the second dielectric layer, the second etch stop layer and a portion of the first dielectric layer, wherein the first partial via is separated from the bottom metal by the first dielectric layer, and the second partial via is separated from the top plate by the etch stop pad.

The above and other aspects of the invention will become better understood with regard to the following detailed description of the preferred but non-limiting embodiment(s). The following description is made with reference to the accompanying drawings.

DETAILED DESCRIPTION OF THE INVENTION

Use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The present specification provides various embodiments to illustrate the technical features of various embodiments of the present invention. The arrangement of the components in the embodiments is for illustrative purposes and is not intended to limit the invention.

In the present application, an improved method for fabricating a semiconductor device is provided. In particular, during fabricating a semiconductor device including a semiconductor element, a first partial via and a second partial via are formed. Thus, in the following step of forming trenches connected to the first partial via and the second partial via, a first dielectric layer disposed below the first partial via can protect the bottom metal from being damaged, and the etch stop pad disposed below the second partial via can protect the top plate from being damaged. Therefore, the remained first dielectric layer and the remained etch stop pad can replace the gap fill plug (GFP) process, and the cost can be reduced, the semiconductor device having an excellent electrical property (such as having good quality of interconnections) can be formed.

Figure 1:
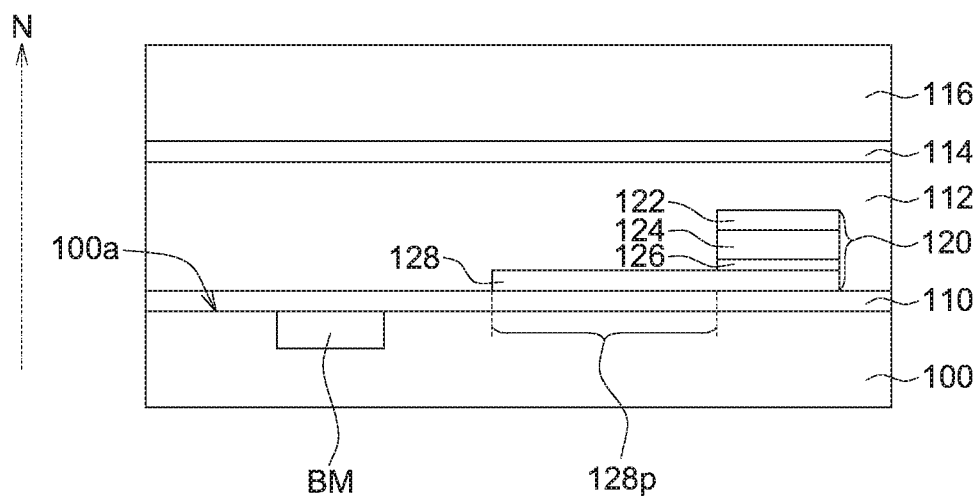
FIGS. 1-5 are cross-sectional views showing a process for fabricating a semiconductor device according to an embodiment of the invention.

Referring to FIG. 1, a preliminary structure 10' is provided. The preliminary structure 10' may be formed in the following steps. Firstly, a substrate 100 is provided. A bottom metal BM is embedded in the substrate 100. Then, a first etch stop layer 110, a first dielectric layer 112, a second etch stop layer 114 and a second dielectric layer 116 are sequentially stacked on a top surface 100a of the substrate 100. A semiconductor element 120 is disposed on the first etch stop layer 110 and is covered by the first dielectric layer 112.

In some embodiments, the semiconductor element 120 may be a resistor, a capacitor or other suitable semiconductor element. In the present embodiment, the semiconductor element 120 is a capacitor, but the present invention is no limited thereto.

In the present embodiment, the semiconductor element 120 includes a bottom plate 128, a top plate 124 disposed on the bottom plate 128, a dielectric film 126 disposed between the top plate 124 and the bottom plate 128, and an etch stop pad 122 disposed on the top plate 124. In some embodiments, the bottom plate 128 may have a width larger than that of the top plate 124 in a direction parallel to the top surface 100a of the substrate 100, but the present invention is not limited thereto. A protruding portion 128p of the bottom plate 128 may be non-overlapped with the top plate 124 in the normal direction N of the top surface.

In the present embodiment, the bottom metal BM and the semiconductor element 120 may be non-overlapping in a normal direction N of the top surface 100a of the substrate 100, but the present invention is not limited thereto.

In some embodiments, the substrate 100 may include silicon, germanium or other suitable material. The substrate 100 may include an epitaxial layer, doped regions, isolation features or other suitable structures. The first etch stop layer 110 and the second etch stop layer 114 may include nitride or other suitable material. The first dielectric layer 112 and the second dielectric layer 116 may include oxide or other suitable material. For example, the first etch stop layer 110 and the second etch stop layer 114 may be SiN or SiON, and the first dielectric layer 112 and the second dielectric layer 116 may be $SiO_2$.

Figure 2:
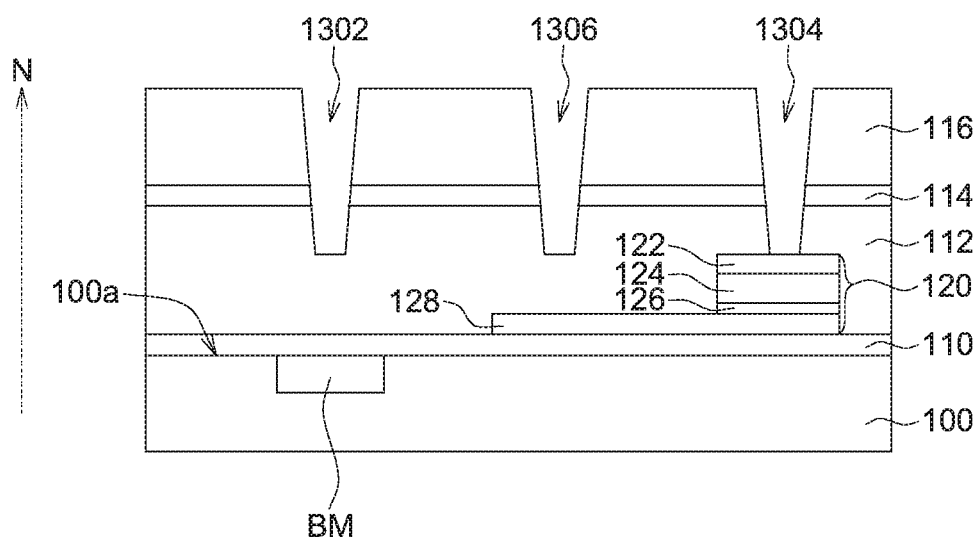

Referring to FIG. 2, a first etching process is performed to form a first partial via 1302, a second partial via 1304 and a third partial via 1306 penetrating the second dielectric layer 116, the second etch stop layer 114 and a portion of the first dielectric layer 112. The first partial via 1302, the second partial vial 304 and the third partial via 1306 may have a same depth. The first partial via 1302 may be overlapped with the bottom metal BM in the normal direction N of the top surface 100a of the substrate 100. The second partial via 1304 may be overlapped with the top plate 124 in the normal direction N of the top surface 100a of the substrate 100. The third partial via 1306 may be overlapped with the bottom plate 128 (such as the protruding portion 128p) in the normal direction N of the top surface 100a of the substrate 100.

More specifically, the first partial via 1302 is separated from the bottom metal BM by the first etch stop layer 110 and the first dielectric layer 112. The second partial via 1304 is separated from the top plate 124 by the etch stop pad 122. The third partial via 1306 is separated from the bottom plate 128 by the first dielectric layer 112. In some embodiments, the second partial via 1304 is separated from the top plate 124 by both of the etch stop pad 122 and a portion of the first dielectric layer 112.

Figure 3:
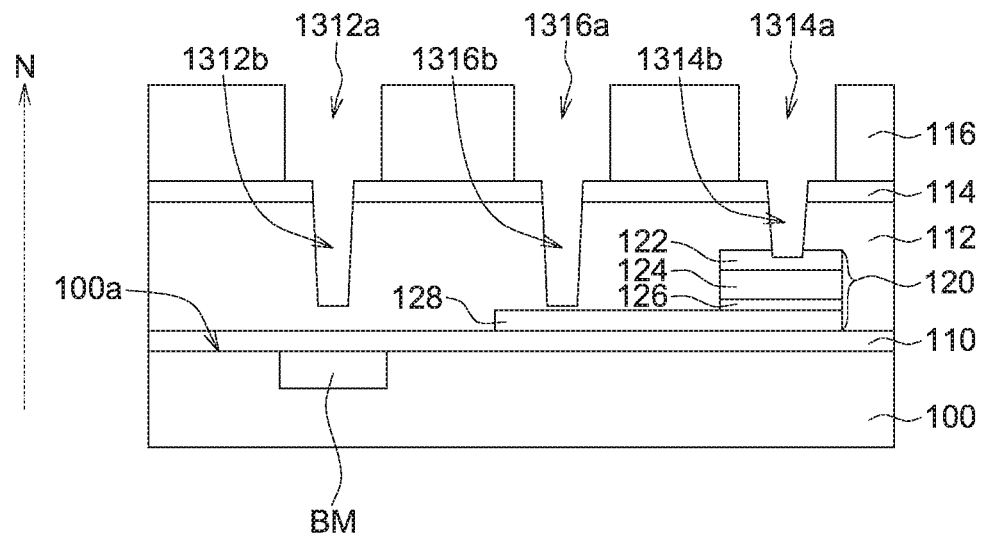

Referring to FIG. 3, a second etching process is performed to transfer the first partial via 1302 into a first trench 1312a and a first extending via 1312b connected to the first trench 1312a, transfer the second partial via 1304 into a second trench 1314a and a second extending via 1314b connected to the second trench 1314a, and transfer the third partial via 1306 into a third trench 1316a and a third extending via 1316b connected to the third trench 1316a. The first trench 1312a, the second trench 1314a and the third trench 1316b may have a width in a direction parallel to the top surface 100a greater than that of the first extending via 1312b, the second extending via 1314b and the third extending via 1316b, respectively.

Since the first dielectric layer 112 is disposed below the first partial via 1302 and the third partial via 1306, and the etch stop pad 122 is disposed below the second partial via 1304, the bottom metal BM, the bottom plate 128 and the top plate 124 can be protected by the remained first dielectric layer 112 and the remained etch stop pad 122 during the second etching process.

In some embodiments, the second etching process has a first etching rate to the first dielectric layer 112 and a second etching rate to the etch stop pad 122, and the first etching rate is greater than the second etching rate. That is, each of the first extending via 1312b and the third extending via 1316b may have a depth greater than that of the second extending via 1314b. The second extending via 1314b may be separated from the top plate 124 by a remaining portion of the etch stop pad 122.

Figure 4:
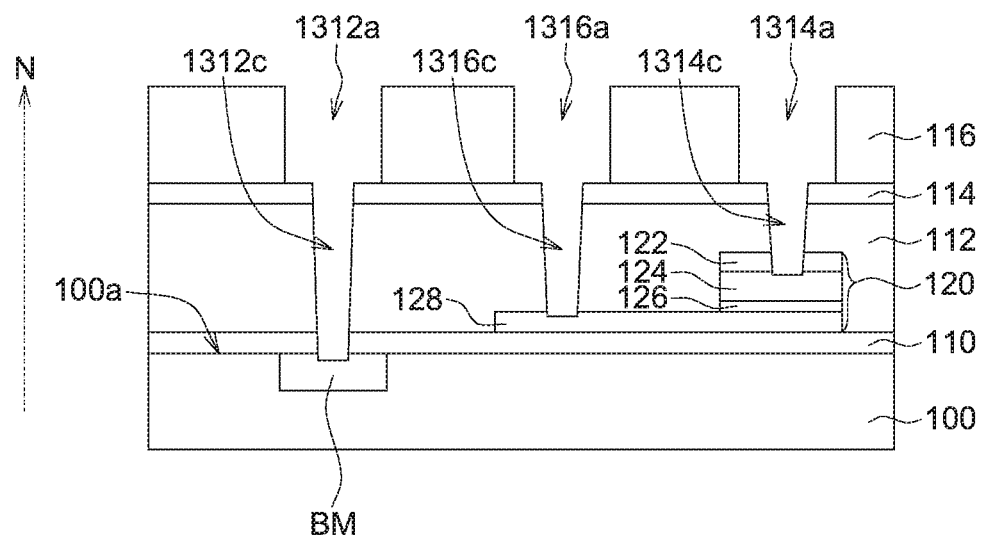

Referring to FIG. 4, a punch through process is performed to extend the first extending via 1312b to become a first penetrating via 1312c connected to the bottom metal BM, extend the second extending via 1314b to become a second penetrating via 1314c connected to the top plate 124, and extend the third extending via 1316b to become a third penetrating via 1316c connected to the bottom plate 128. In other words, the bottom metal BM is exposed from the first trench 1312a and the first penetrating via 1312c, the top plate 124 is exposed from the second trench 1314a and the second penetrating via 1314c, and the bottom plate 128 is exposed from the third trench 1316a and the third penetrating via 1316c.

Figure 5:
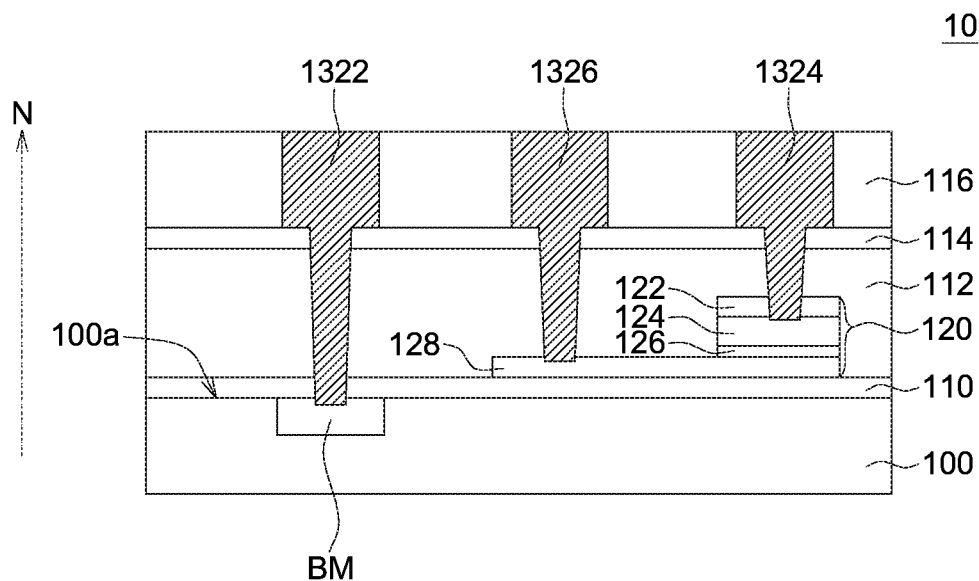

Referring to FIG. 5, a deposition process is performed to fill a conductive material into the first trench 1312a, the first penetrating via 1312c, the second trench 1314a, the second penetrating via 1314c, the third trench 1316a, and the third penetrating via 1316c. The conductive material may include tungsten, copper or other suitable conductive materials. In this way, a first interconnection 1322 electrically connected to the bottom metal BM, a second interconnection 1324 electrically connected to the top plate 124, and a third interconnection electrically connected to the bottom plate 128 are formed, and the semiconductor device 10 including the semiconductor element 120 is formed.

Figure 6:
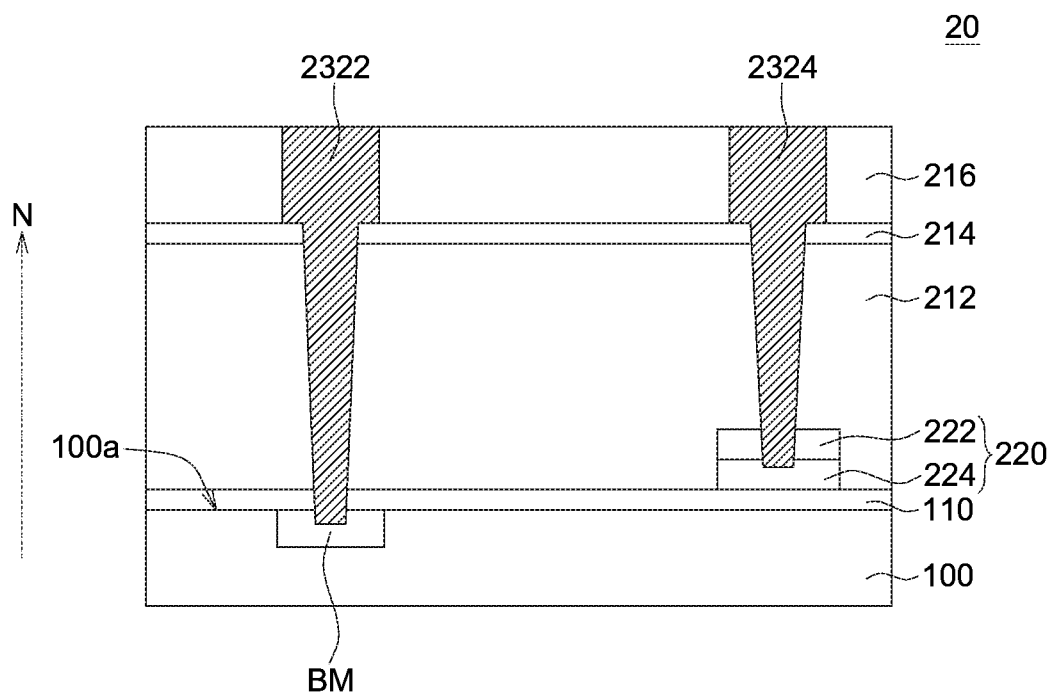
FIG. 6 is a cross-sectional view showing a semiconductor device according to another embodiment of the invention.

FIG. 6 is a cross-sectional view showing a semiconductor device 20 according to another embodiment of the invention. The semiconductor device 20 is similar to the semiconductor device 10, the difference is in that the semiconductor element 220 includes the etch stop pad 222 and the top plate 224, but not include the bottom plate.

The semiconductor device 20 includes a substrate 100; a bottom metal BM embedded in the substrate 100; a first etch stop layer 110, a first dielectric layer 212, a second etch stop layer 214 and a second dielectric layer 216 sequentially stacked on a top surface 100a of the substrate 100; a semiconductor element 220 disposed on the first etch stop layer 110, wherein the semiconductor element 220 includes a top plate 224 and an etch stop pad 222 disposed on the top plate 224; a first interconnection 2322 electrically connected to the bottom metal BM; and a second interconnection 2324 electrically connected to the top plate 224. In the present embodiment, the semiconductor element 220 may be a resistor.

The methods for fabricating the first interconnection 2322 and the second interconnection 2324 are similar to that of the first interconnection 1322 and the second interconnection 1324, respectively, and the repetitive description is omitted herein.

According to an embodiment of present application, a method for fabricating a semiconductor device is provided. The method comprises: providing a substrate having a top surface; forming a bottom metal embedded in the substrate; forming a first etch stop layer, a first dielectric layer, a second etch stop layer and a second dielectric layer sequentially stacked on the top surface of the substrate; forming a semiconductor element disposed on the first etch stop layer, wherein the semiconductor element comprises a top plate and an etch stop pad disposed on the top plate; performing a first etching process to form a first partial via and a second partial via penetrating the second dielectric layer, the second etch stop layer and a portion of the first dielectric layer, wherein the first partial via is separated from the bottom metal by the first dielectric layer, and the second partial via is separated from the top plate by the etch stop pad.

Since a first partial via corresponding to a bottom metal is formed and separated from the bottom metal by a first dielectric layer, and a second partial via corresponding to a top plate in the semiconductor element is formed and separated from the top plate by an etch stop pad disposed on the top plate, the first dielectric layer can protect the bottom metal from being damaged, and the etch stop pad can protect the top plate from being damaged during the following etching process (such as the second etching process). Further, the remained first dielectric layer and the remained etch stop pad can replace the gap fill plug process, and the cost can be reduced. Therefore, in the present application, the semiconductor device including the semiconductor element can be made by a simple and cost saving process, and can have an excellent electrical property, such as having good quality of interconnections.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a semiconductor device comprising:
    providing a substrate having a top surface;
    forming a bottom metal embedded in the substrate;
    forming a first etch stop layer, a first dielectric layer, a second etch stop layer and a second dielectric layer sequentially stacked on the top surface of the substrate;
    forming a semiconductor element disposed on the first etch stop layer, wherein the semiconductor element comprises a top plate and an etch stop pad disposed on the top plate; and
        performing a first etching process to form a first partial via and a second partial via penetrating the second dielectric layer, the second etch stop layer and a portion of the first dielectric layer, wherein the first partial via is separated from the bottom metal by the first dielectric layer, and the second partial via is separated from the top plate by the etch stop pad;
        wherein the first partial via and the second partial via have a same depth.

2. The method according to claim 1, further comprising:
    performing a second etching process to transfer the first partial via into a first trench and a first extending via connected to the first trench and transfer the second partial via into a second trench and a second extending via connected to the second trench, wherein the second etching process has a first etching rate to the first dielectric layer and a second etching rate to the etch stop pad, and the first etching rate is greater than the second etching rate.

3. The method according to claim 2, further comprising:
    performing a punch through process to extend the first extending via to become a first penetrating via connected to the bottom metal and to extend the second extending via to become a second penetrating via connected to the top plate; and
    filling a conductive material into the first trench, the first penetrating via, the second trench and the second penetrating via.

4. The method according to claim 2, wherein a depth of the first extending via is greater than a depth of the second extending via.

5. The method according to claim 2, wherein the second extending via is separated from the top plate by a remaining portion of the etch stop pad.

6. The method according to claim 1, wherein the first partial via is overlapped with the bottom metal and the second partial via is overlapped with the top plate in a normal direction of the top surface of the substrate.

7. The method according to claim 1, wherein the semiconductor element further comprises a bottom plate disposed on the first etch stop layer and a dielectric film disposed between the top plate and the bottom plate.

8. The method according to claim 1, further comprising:
    forming a third partial via penetrating the second dielectric layer, the second etch stop layer and a portion of the first dielectric layer by the first etching process; and
    performing a second etching process to transfer the first partial via into a first trench and a first extending via connected to the first trench, transfer the second partial via into a second trench and a second extending via connected to the second trench, and transfer the third partial via into a third trench and a third extending via connected to the third trench;
    wherein the second etching process has a first etching rate to the first dielectric layer and a second etching rate to the etch stop pad, and the first etching rate is greater than the second etching rate.

9. The method according to claim 8, further comprising:
    performing a punch through process to extend the first extending via to become a first penetrating via connected to the bottom metal, to extend the second extending via to become a second penetrating via connected to the top plate, and to extend the third extending via to become a third penetrating via connected to the bottom plate; and
    filling a conductive material into the first trench, the first penetrating via, the second trench, the second penetrating via, the third trench and the third penetrating via.

10. The method according to claim 1, wherein the semiconductor element is a resistor or a capacitor.

* * * * *